United States Patent [19]

McElroy

[11] 4,271,421
[45] Jun. 2, 1981

[54] HIGH DENSITY N-CHANNEL SILICON GATE READ ONLY MEMORY

[75] Inventor: David J. McElroy, Houston, Tex.

[73] Assignee: Texas Instruments Incorporated, Dallas, Tex.

[21] Appl. No.: 11,735

[22] Filed: Feb. 12, 1979

Related U.S. Application Data

[62] Division of Ser. No. 762,612, Jan. 26, 1977, Pat. No. 4,151,020.

[51] Int. Cl.³ .................... H01L 27/04; H01L 29/78; G11C 11/40
[52] U.S. Cl. .................... 357/41; 357/23; 357/50; 357/59; 365/104
[58] Field of Search .................... 357/23, 45, 41, 50, 357/59; 307/238; 365/104

[56] References Cited

U.S. PATENT DOCUMENTS

| 3,544,858 | 12/1970 | Kooi | 357/23 |
| 3,711,753 | 1/1973 | Brand et al. | 357/41 |
| 3,914,855 | 10/1974 | Cheney et al. | 357/41 |
| 4,021,781 | 5/1977 | Caudel | 365/104 |
| 4,023,195 | 5/1977 | Richman | 357/41 |

Primary Examiner—William D. Larkins
Attorney, Agent, or Firm—John G. Graham

[57] ABSTRACT

An N-channel silicon gate read only memory or ROM array of very high bit density is made by providing columns in the form of parallel N+ moats separated by field oxide and removing small areas of the field oxide in a pattern of "1's" and "0's" according to the ROM program. Gate oxide is grown in the areas where field oxide is removed, and parallel polycrystalline silicon strips are laid down over the field oxide and gate oxide areas normal to the moats, providing the rows. The ROM may be made as part of a standard double level poly, N-channel, self-aligned silicon gate process. The columns may include an output line and several intermediate lines for each ground line so that a virtual ground format is provided. An implant step may be used to avoid the effects of exposed gate oxide so that zero-overlap design rules are permitted.

10 Claims, 16 Drawing Figures

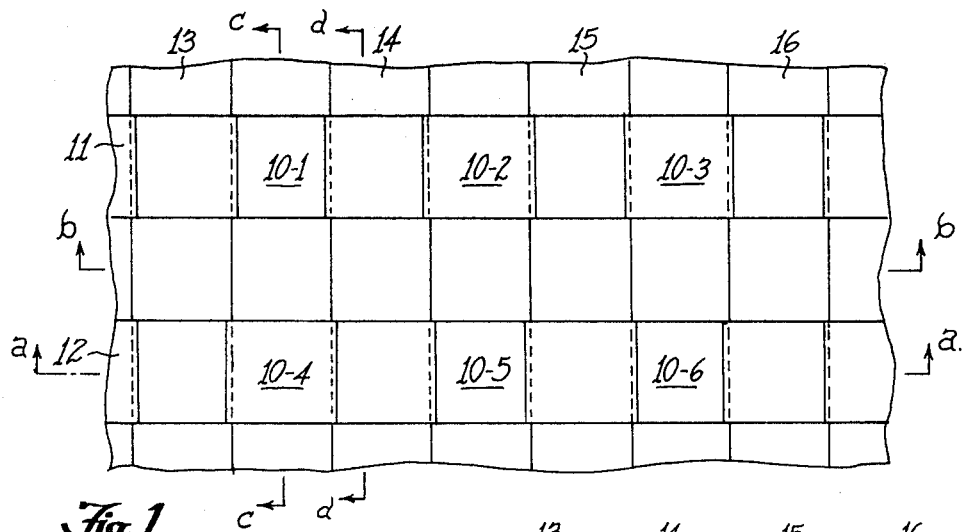
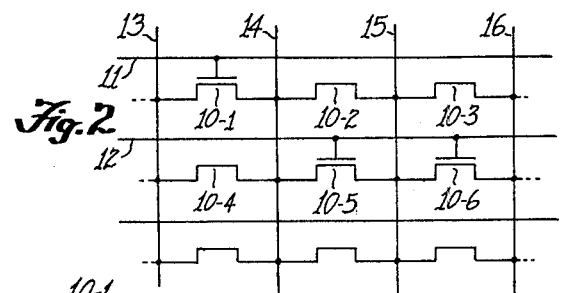
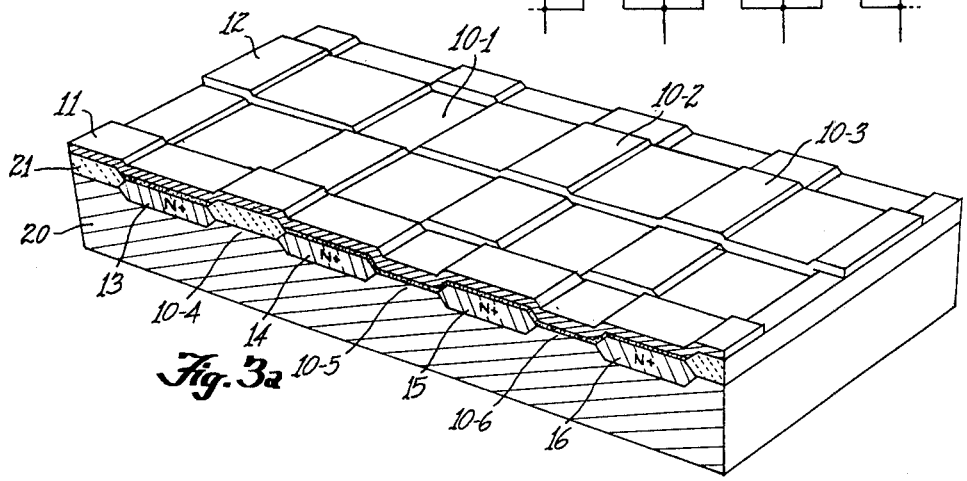
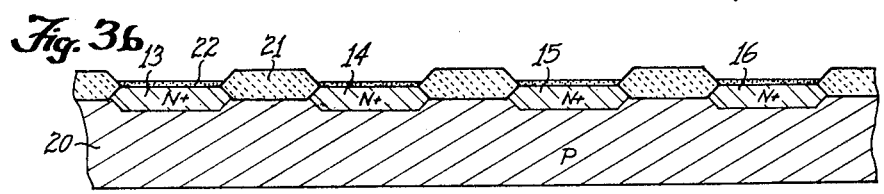
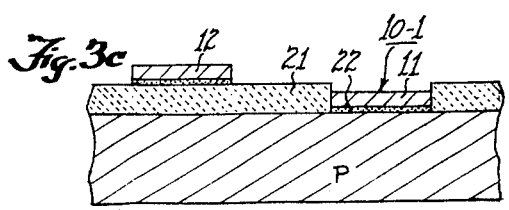
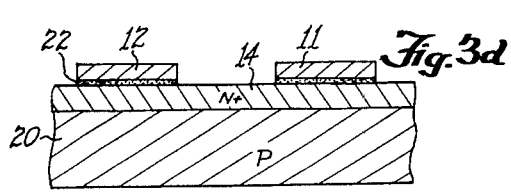

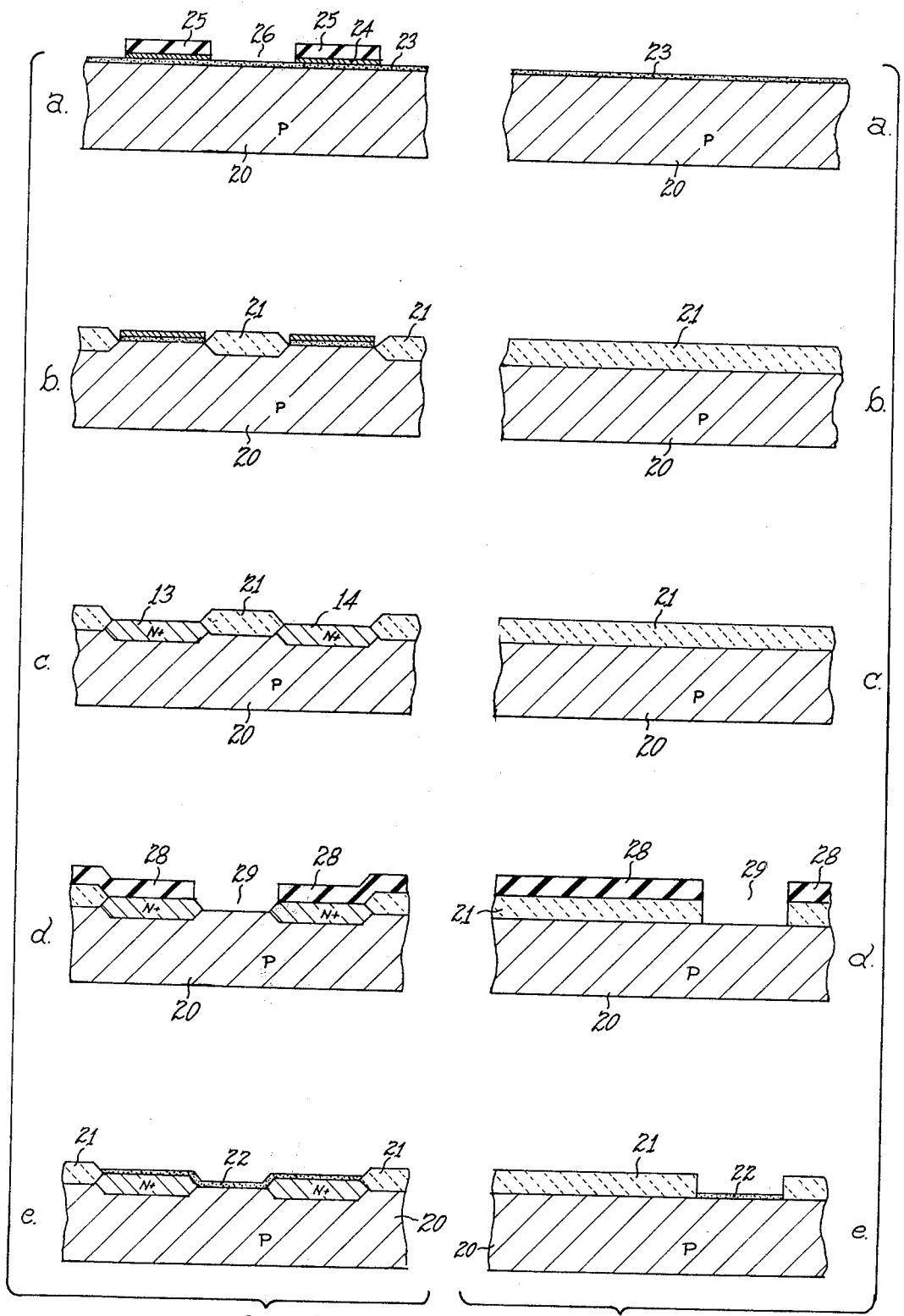

HIGH DENSITY N-CHANNEL SILICON GATE READ ONLY MEMORY

This is a division, of application Ser. No. 762,612, filed Jan. 26, 1977, U.S. Pat. No. 4,151,020.

BACKGROUND OF THE INVENTION

This invention relates to semiconductor memory devices, and more particularly to a high density N-channel silicon gate MOS read only memory and a process for making it.

Semiconductor memory devices are widely used in the manufacture of digital equipment, particularly minicomputers and microprocessor systems. Often bulk storage of fixed programs is provided by MOS read only memory devices or "ROMS". The economics of manufacture of these devices, and of mounting them on circuit boards in the system, are such that the number of memory bits per semiconductor chip is advantageously as high as possible. ROMs of 8 K and 16 K sizes are typical, these referring to 8192 or 16384 bits per chip. This dictates that cell sizes for the storage cells of the ROM be quite small. P-channel ROMs of this size can be relatively easily fabricated in the manner set forth in U.S. Pat. No. 3,541,543, assigned to Texas Instruments. However, most microprocessor and computer parts are now made by the N-channel silicon gate process because of the shorter access times provided. The N-channel process is not favorable to layout of ROM cells of small size. Prior cells have required contact areas between metal or polysilicon lines and the semiconductor material, using excessive space on the chip, or metal leads have been used in the array, which introduces unwanted capacitance. Other cells have been of slow operating speed, had high series resistance, or required processing not compatible with standard manufacturing techniques. Further, it has not been possible to use implant to correct misalignment which exposes gate oxide, so overlap was needed in the design rules. Exemplary prior N-channel, silicon gate ROMs are disclosed in U.S. Pat. No. 4,059,826, issued to G. D. Rogers, and application Ser. No. 701,932, filed July 1, 1976 by G. R. Mohan Rao (now abandoned and included in continuation-in-part application Ser. No. 841,502, filed Oct. 11, 1977), all assigned to Texas Instruments.

It is the principal object of this invention to provide a semiconductor read only memory cell of small size. Another object is to provide a small-area, N-channel, silicon gate MOS ROM cell which is made by a process compatible with standard manufacturing techniques.

SUMMARY OF THE INVENTION

In accordance with an embodiment of the invention, a metal-oxide-semiconductor read only memory, or MOS ROM, is formed by an array of potential MOS transistors where polysilicon strips on a silicon chip define the address lines, and output and ground lines (as well as sources and drains of the transistors) are defined by N+ diffused regions perpendicular to the address lines. In the array, each potential MOS transistor is a storage cell, with each cell being programmed to store a logic "1" or "0" by providing either a thin oxide gate region beneath a polysilicon address line or leaving thick field oxide in place. No metal or polysilicon to silicon contacts are needed in the cell and the resulting cell size is quite small.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a greatly enlarged plan view of a small portion of a semiconductor chip showing the physical layout of a part of a ROM array made according to the invention;

FIG. 2 is an electrical schematic diagram of the ROM of FIG. 1;

FIGS. 3a-3d are elevation views in section of the cell of FIG. 1, taken along the lines a—a, b—b, c—c, and d—d, respectively; and FIGS. 4a-4e and 5a-5e are elevation views in section of the semiconductor device of FIGS. 1 and 3a-3d, at successive stages in the manufacturing process, taken along the line a—a and d—d, respectively in FIG. 1.

DETAILED DESCRIPTION OF SPECIFIC EMBODIMENT

Referring to FIG. 1, a layout of a small part of an N-channel MOS ROM is shown. Although only six cells 10 are shown, usually the ROM would contain some large power of two, such as $2^{14}$ or 16384, $2^{16}$ or 65536, etc. cells on a chip of perhaps 150 mils on a side. Each cell is about 0.25 mil sq. or less. Decoders, input/output circuits, and clock generators would be also on the chip. FIG. 2 shows the six cells of FIG. 1, but in electrical schematic form. The ROM consists of cells 10-1 to 10-6 located at the intersections of polysilicon lines 11 and 12 and potential MOS transistor cell areas defined between N+ diffused regions 13, 14, 15, and 16. Using a decoder of the type shown at FIG. 14 of U.S. Pat. No. 3,991,305, issued Nov. 9, 1976 to J. H. Raymond and E. R. Caudel, assigned to Texas Instruments, one of the lines 13-16 is connected to ground or Vss, while an adjacent one of the lines is treated as an output line. The ROM is thus of the "virtual" ground type. The elected output line would be connected to a load device which would hold it at Vdd except when the selected cell grounded it to a Vss line. The lines 11 and 12 would be connected to an X address decoder in accord with standard practice, which would select only one of the lines to go to Vdd, or about 10 to 12 volts, for a given address. The others would remain at Vss. In a 16K ROM, for example, there may be 128 row lines like lines 11 and 12; likewise, there would be 128 "Y" or column lines like 13-16, usually grouped to provide a sixteen bit word, as an example. In the segment shown, cells 10-1, 10-3, 10-5 and 10-6 are programmed as zeros, the remainder as ones.

The structure of the device of FIGS. 1 and 2 is best understood by reference to FIGS. 3a-3d, which are sectional views showing some of the potential MOS transistors realized as devices and some not. The device is fabricated on a P-type silicon chip 20, and the N+ diffused (or implanted) regions 13, 14, 15 and 16 extend into the surface of the chip, between sections of a field oxide layer 21. Where a gate of a potential field effect transistor is realized, the field oxide 21 is removed and a thin oxide layer 22 provides a gate insulator. The polysilicon strips 11 and 12 extend along the chip on top of the field oxide 21, except at the positions 10-1, 10-3, 10-5 and 10-6 where zeros are programmed, and here the polysilicon dips down to the level of the gate oxide 22, seen in FIGS. 3a and 3d. The cell size of the ROM of FIG. 1 is less than 0.25 sq. mil per bit, which is less than half that of N-channel ROMs made by other techniques.

Referring now to FIGS. 4a–4d and 5a–5d, a process for making the N-channel, silicon-gate MOS integrated circuit device of FIGS. 1 and 3a–3d will be described. The process is the same as a conventional N-channel, double-level polysilicon gate self-aligned process except for the way the cells are formed by etching away the field oxide. In areas on the chip away from the cell array, double-level poly MOS transistors of conventional form would be employed in decoders, buffers, clock generators, etc. The starting material is a slice of P-type monocrystalline silicon, perhaps 3 inches in diameter and 20 to 40 mils thick, cut on the <100> plane, of a resistivity of about 6 to 8 ohm-cm. In the FIGURES, the chip or bar 20 represents a very small part of the slice, perhaps 1 or 2 mils wide. After appropriate cleaning, the slice is oxidized by exposing to oxygen in a furnace at an elevated temperature of perhaps 1000° C. to produce an oxide layer 23 of a thickness of about 800 to 1000 Å. Next, a layer 24 of silicon nitride of about 1000 Å thickness is formed by exposing to an atmosphere of silane and ammonia in an rf plasma reactor. A coating 25 of photoresist is applied to the entire top surface of the slice, then exposed to ultraviolet light through a mask which defines the desired pattern of N+ regions 13, 14, 15 and 16, and developed. This leaves areas 26 where nitride is to be etched away by a nitride etchant which removes the exposed part of the nitride layer 24 but does not remove the oxide layer 23 and does not react with the photoresist 25.

If a channel stop is desired the slice may be now subjected to an ion implant step, whereby impurity atoms are introduced into regions of silicon not masked by photoresist 25, nitride 24 and/or oxide 23. The photoresist is preferably left in place as it masks the implant; the oxide layer 23 is left in place during the implant because it prevents the implanted atoms from out-diffusing from the surface during subsequent heat treatment. This implant is at a dosage of about $10^{15}/cm^2$ at 150 KeV.

The next step in the process is formation of field oxide 21 as seen in FIGS. 4b and 5b, which is done by subjecting the slice to steam or an oxidizing atmosphere at about 900° C. for perhaps 5 to 10 hours. This causes a thick field oxide region or layer 21 to be grown as seen in FIG. 4c, and this region extends into the silicon surface because silicon is consumed as it oxidizes. The remaining parts of the nitride layer 24 mask against oxidation. The thickness of this layer 21 is about 5000 to 10,000 Å, about half of which is above the original surface and half below. The doped regions formed by the channel stop implant will be partly consumed, but will also diffuse further into the silicon ahead of the oxidation front.

The nitride layer 24 is removed by etching as well as the underlying oxide layer 23. In areas of the slice where depletion load devices are required, although not pertinent to this invention, a masked ion implant step would be done at this point. Also, windows for polysilicon to silicon contacts in peripheral circuitry would be patterned and etched at this point using photoresist, although none are needed in the ROM array itself. A gate insulator is applied by oxidation and patterned using photoresist. A layer of polycrystalline silicon as the first level polysilicon is deposited over the entire slice in a reactor using standard techniques, then doped with phosphorus to make it highly conductive. The polysilicon layer is next patterned by photoresist operation, creating the first level polysilicon used in other parts of the device but not in the ROM array.

Next, the device is subjected to an N+ diffusion wherein the column lines 13, 14, 15 and 16 are created, as well as the sources and drains of the transistors 10 in the array. The field oxide acts as a diffusion mask for this purpose, as seen in FIGS. 4c and 5c, the original oxide 23 having been removed. Phosphorus is deposited and then diffused to a depth of perhaps 8000 Å.

Following the N+ diffusion, the pattern of gates for the cells 10 of the ROM array is created according to the invention. A photoresist layer 28 is applied to the surface of the slice then exposed to UV light through a mask which defines the ROM code, opening holes 29 where gates are to be created or potential MOS transistors are to be realized. Then, as seen in FIGS. 4d and 5d, the field oxide 21 is etched away in the holes 29, exposing the silicon wafer 20.

Next, the so-called interlevel oxide is grown, where in other parts of the device away from the ROM array the first level polysilicon is coated with thermal oxide to insulate first and second level polysilicon. In the ROM array, this interlevel oxide creates the gate oxide 22. As seen in FIGS. 4e and 5e, the oxide 22 of about 1000 Å is grown in the areas where field oxide has been removed.

The second level polysilicon is next deposited, doped with phosphorus, perhaps by implant, then patterned using photoresist to create the row lines 11 and 12 as well as the gates of the transistors in the cell array.

To maximize density, the width of the second level polysilicon lines 11 and 12 is the same as the width of the holes 29 of FIGS. 4d and 5d, i.e., no overlap or oversize. Then, to avoid problems of exposed gate oxide, according to my U.S. Pat. No. 4,061,506, issued Dec. 6, 1977, assigned to Texas Instruments, the slice is subjected to an implant step whereby boron is implanted at a dosage of 2 to $3 \times 10^{12}/cm^2$, 50 to 70 KeV. This creates shallow P+ areas where the gate oxide 22 might be exposed due to misalignment of masks; the P+ areas cannot be easily inverted so the devices even though misaligned are not subject to failures caused by exposed thin oxide.

For other areas of the slice fabrication of the device is continued by depositing a thick layer 31 of phosphorus-doped oxide in low temperature reaction process using conventional chemical vapor deposition techniques, covering the entire slice. Subsequently, windows are opened in this oxide layer in areas where contact is to be made to regions of the silicon or to the polysilicon layer using photoresist masking and etching. Then a layer of aluminum is deposited on the entire slice, for use as interconnections in peripheral circuitry but not in the ROM array, and patterned using photoresist masking to provide the desired metal interconnections. Ultimately, the slice is scribed and broken into individual chips, each perhaps 150 mils on a side, and the chips are mounted in suitable packages.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A read only memory array formed in a face of semiconductor body comprising a plurality of rows and columns of insulated gate field effect transistor areas, a plurality of elongated generally parallel conductive strips at said face providing gates of said transistors, the gates of all transistors in each row being provided by a separate one of the conductive strips, a plurality of elongated generally parallel heavily-doped semiconductor regions in said face providing the sources and drains of the transistors and providing output lines and ground lines for the array, all of the sources or drains of all transistors in each column being provided by a separate one of said semiconductor regions, thick field oxide being provided between said semiconductor regions and extending into said face substantially below the upper surface of said semiconductor regions, selected areas of thin gate oxide underlying the conductive strips between said semiconductor regions where thick oxide has been removed at a plurality of positions of the array where transistors exist, the remaining positions of the array having thick oxide underlying the conductive strips where transistors do not exist.

2. A memory array according to claim 1 wherein the transistors are of the N-channel silicon gate type, the semiconductor body is silicon, and the conductive strips are polycrystalline silicon.

3. A memory array according to claim 2 wherein the field oxide is many times thicker than the gate oxide.

4. A memory array according to claim 3 wherein the semiconductor regions are N+ diffused.

5. A memory array according to claim 4 wherein the array is of the virtual ground type and there is an output line and a plurality of intermediate output lines for each ground line.

6. An N-channel silicon gate metal-oxide-semiconductor read only memory comprising a P-type silicon chip, a thick field oxide coating on most of a face of the chip partially recessed into said face, a plurality of parallel elongated N+ regions extending along the face separated from one another by field oxide, the upper surface of the N+ regions being above the interface between said field oxide and the underlying silicon of said face, a plurality of address lines in the form of parallel polycrystalline silicon strips extending along the face overlying the thick oxide generally perpendicular to the elongated N+ regions, potential transistors existing at a plurality of areas between elongated N+ regions beneath the polycrystalline silicon strips, thin gate oxide being located at some of the plurality of areas and thick field oxide being located at other of the plurality of areas, the thin gate oxide being in areas where field oxide has been removed so the thin gate oxide is recessed below the upper surface of the N+ regions.

7. A read only memory according to claim 6 wherein the field oxide is about ten times as thick as the gate oxide.

8. A read only memory according to claim 7 wherein the N+ regions adjacent the gate oxide at said some of the plurality of areas provide the source and drain regions of the transistors.

9. A read only memory according to claim 6 wherein some of the elongated regions provide ground lines and some provide output lines.

10. A read only memory according to claim 9 wherein the level of the gate oxide is below that of the polycrystalline silicon strips and below that of the N+ regions.

* * * * *